United States Patent
Ackermann et al.

(10) Patent No.: US 11,774,306 B2
(45) Date of Patent: Oct. 3, 2023

(54) SYSTEM AND METHOD FOR MAINTENANCE OF ROTATION-LIFT ASSEMBLY

(71) Applicant: Applied Materials, Inc., Santa Clara, CA (US)

(72) Inventors: Thomas Ackermann, Feichten (DE); Torsten Fankhaenel, Freiberg (DE)

(73) Assignee: Applied Materials, Inc., Santa Clara, CA (US)

( * ) Notice: Subject to any disclaimer, the term of this patent is extended or adjusted under 35 U.S.C. 154(b) by 1108 days.

(21) Appl. No.: 16/451,444

(22) Filed: Jun. 25, 2019

(65) Prior Publication Data

US 2019/0393060 A1 Dec. 26, 2019

Related U.S. Application Data

(60) Provisional application No. 62/690,014, filed on Jun. 26, 2018.

(51) Int. Cl.
*G01L 5/00* (2006.01)
*H01L 21/67* (2006.01)
*H01L 21/687* (2006.01)
*G01L 25/00* (2006.01)

(52) U.S. Cl.
CPC .............. *G01L 5/00* (2013.01); *G01L 25/003* (2013.01); *H01L 21/67253* (2013.01); *H01L 21/68785* (2013.01); *H01L 21/68792* (2013.01); *H02P 2205/05* (2013.01)

(58) Field of Classification Search
USPC .......................................................... 702/41
See application file for complete search history.

(56) References Cited

U.S. PATENT DOCUMENTS

| | | | |
|---|---|---|---|
| 6,885,972 B2 | 4/2005 | Samata et al. | |
| 6,909,993 B2 | 6/2005 | Nakao et al. | |
| 6,944,572 B2 | 9/2005 | Ushiku et al. | |
| 7,844,559 B2 | 11/2010 | Lam et al. | |
| 2004/0064212 A1 | 4/2004 | Samata et al. | |
| 2009/0139448 A1* | 6/2009 | Hirata ................. | C23C 16/4584 117/107 |
| 2010/0200545 A1* | 8/2010 | Koelmel ............. | H01L 21/6838 156/345.55 |
| 2011/0132873 A1* | 6/2011 | Tsujimoto ......... | H01L 21/68742 118/712 |
| 2013/0253670 A1* | 9/2013 | Chung ............... | B23Q 17/0961 700/79 |
| 2015/0027366 A1* | 1/2015 | Horino ............. | H01L 21/68785 118/500 |

* cited by examiner

*Primary Examiner* — Paul D Lee
(74) *Attorney, Agent, or Firm* — Patterson + Sheridan, LLP

(57) ABSTRACT

Embodiments of the present disclosure generally relate to apparatus and methods for semiconductor processing, more particularly, to a system and method for monitoring a rotation-lift assembly of a process chamber. The rotation-lift assembly outputs a torque feedback signal which is processed by a controller to determine if the rotation-lift assembly has a fault or is near failure. The controller determines torque data from the torque feedback signal, compares the torque data to preexisting torque data, and, based on the comparison, issue a notice of a state of the rotation-lift assembly.

18 Claims, 4 Drawing Sheets

SYSTEM AND METHOD FOR MAINTENANCE OF ROTATION-LIFT ASSEMBLY

CROSS-REFERENCE TO RELATED APPLICATION

This application claims benefit of U.S. provisional patent application No. 62/690,014, filed Jun. 26, 2018, the entirety of which is herein incorporated by reference.

BACKGROUND

Field

Embodiments of the present disclosure generally relate to apparatus and methods for semiconductor processing, and, more particularly, to maintenance prediction for processing components such as a rotation-lift assembly in a substrate process chamber.

Description of the Related Art

In various instances, to process semiconductor substrates, a substrate is placed on a susceptor which is rotated by a rotation-lift assembly of a process chamber. To reduce defects and improve process repeatability, the rotation-lift assembly rotates the susceptor at specified speeds during processing. Further, at the completion of processing, the rotation-lift assembly places the susceptor at the home position to allow a processed substrate to be unloaded from the corresponding process chamber without causing damage to the processed substrate.

However, despite the use of a feedback loop to control the rotation of the susceptor and positioning of the susceptor at the home position, rotation-lift assemblies that have experienced wear are unable to maintain the proper rotation speeds and/or position the susceptor at the home position. Failed or failing rotation-lift assemblies are often only identified after the rotation-lift assemblies have already experienced failure, which leads to significant downtime of the process chamber and/or loss of processed substrates. Thus, there is a need to be able to identify rotation-lift assemblies before the rotation-lift assemblies fail, such that these rotation-lift assemblies can be replaced before significant downtime of the corresponding process chamber and/or loss of processed substrates.

SUMMARY

In one embodiment, a method for monitoring a rotation-lift assembly of a process chamber comprises receiving a torque feedback signal from the rotation-lift assembly, processing the torque feedback signal to identify torque data, comparing the torque data to preexisting torque data, and issuing a notice of a state of the rotation-lift assembly based on the comparison of the torque data to the preexisting torque data. The torque feedback signal corresponds to an amount of torque output by the rotation-lift assembly to rotate a susceptor of the process chamber.

In one embodiment, a substrate process chamber comprises a susceptor, a rotation-lift assembly, and a controller. The susceptor comprises a support shaft and is configured to support a substrate for processing within the substrate process chamber. The rotation-lift assembly is configured to rotate the susceptor during processing, and output a torque feedback signal. The torque feedback signal corresponds to an amount of torque output by the rotation-lift assembly to rotate a susceptor of the process chamber. The controller is coupled to the rotation-lift assembly and is configured to receive the torque feedback signal and process the torque feedback signal to identify torque data. The torque data corresponds to torque output by the rotation-lift assembly when rotating the susceptor. The controller is further configured to compare the torque data to preexisting torque data, and issue a notice of a state of the rotation-lift assembly based on the comparison of the torque data to the preexisting torque data.

In one embodiment, a computer readable storage medium having stored thereon instructions that, when executed by a processor, cause the processor to perform a method monitoring a rotation-lift assembly for a substrate process chamber. The method comprises receiving a torque feedback signal from the rotation-lift assembly, processing the torque feedback signal to identify torque data, comparing the torque data to preexisting torque data, and issuing a notice of a state of the rotation-lift assembly based on the comparison of the torque data to the preexisting torque data. The torque feedback signal corresponds to an amount of torque output by the rotation-lift assembly to rotate a susceptor of the process chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
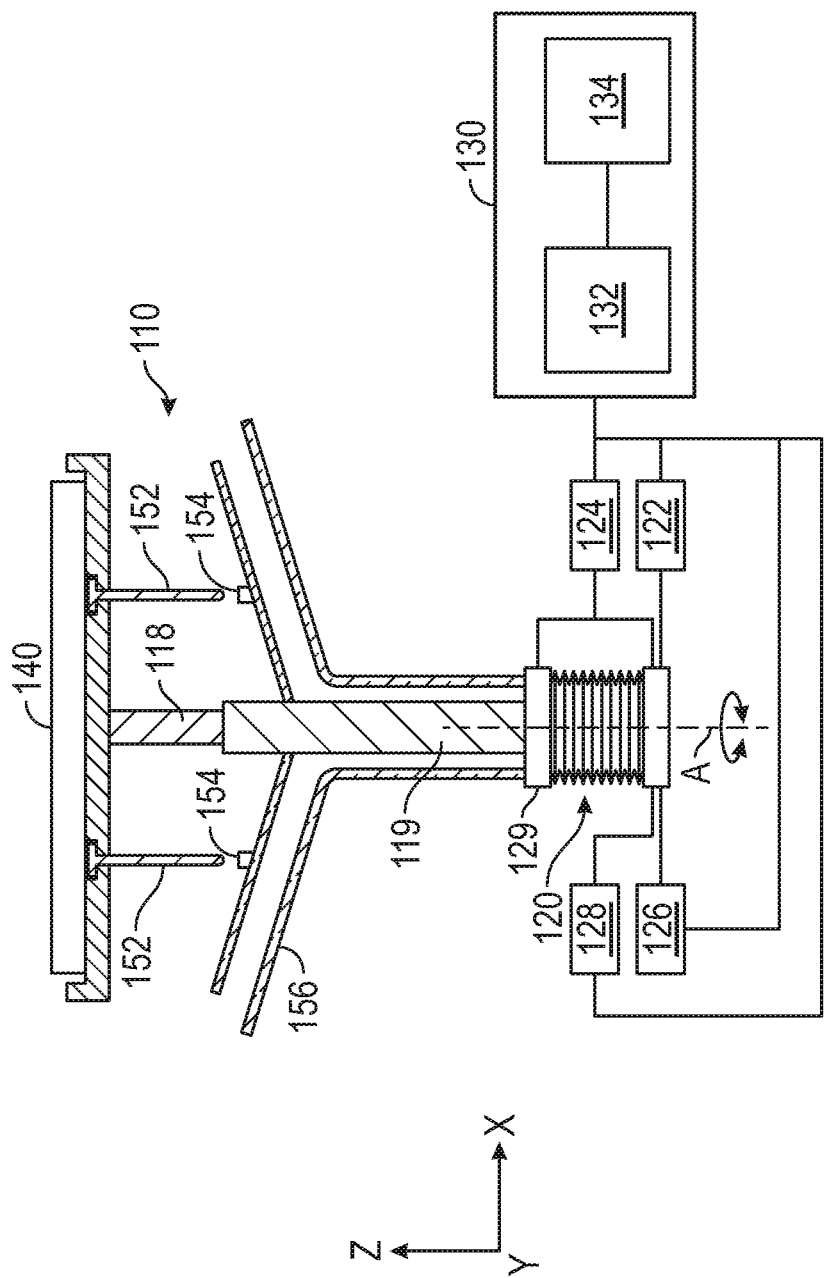
FIG. 1 is a schematic side view of a substrate support apparatus, according to one or more embodiments.

To facilitate understanding, identical reference numerals have been used, where possible, to designate identical elements that are common to the figures. It is contemplated that elements disclosed in one embodiment may be beneficially utilized in other embodiments without specific recitation thereof with respect thereto.

DETAILED DESCRIPTION

Embodiments of the present disclosure generally relate to monitoring elements utilized during semiconductor processing, and more particularly to monitoring a rotational-lift assembly of a process chamber. A controller uses torque data provided by the rotational-lift assembly to identify a rotational-lift assembly that has a fault and/or may be near failure to mitigate downtime of the corresponding process chamber and/or loss of processed substrates.

A "substrate" or "substrate surface," as described herein, generally refers to any substrate surface upon which processing is performed. For example, a substrate surface may include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface may also include dielectric materials such as silicon dioxide, silicon nitride, organosilicates, and carbon dopes silicon oxide or nitride materials. The substrate itself is not limited to any particular size or shape. Although the embodiments herein are generally related to round 200 mm or 300 mm substrates, other shapes, such as polygonal, square, rectangular, curved, or otherwise non-circular workpieces may be utilized.

FIG. 1 illustrates susceptor 110, rotation-lift assembly 120, and controller 130, according to one or more embodiments. The susceptor 110 may be a disk-like substrate support as shown, or may include a ring-like substrate support (not shown), which supports a substrate 140 from the edge of the substrate to expose a backside of the substrate 140 directly to heat from a heat source (e.g., one or more radiant heating lamps or similar heat source). The susceptor 110 may be fabricated from silicon carbide or graphite coated with silicon carbide to absorb radiant energy and conduct the radiant energy to the substrate 140, thus heating substrate 140. Other materials for the susceptor 110 are also contemplated.

The susceptor 110 includes a support shaft (or stem) 118 that is coupled to a rotation-lift assembly 120. The rotation-lift assembly 120 includes one or more actuators (motors) and/or adjustment devices that provide movement and/or adjustment of the position of the support shaft 118 of the susceptor 110. The rotation-lift assembly 120 may include a rotary actuator 122 configured to rotate support shaft 118, and thus the susceptor 110, about the longitudinal axis A of a corresponding process chamber perpendicular to an X-Y plane of the process chamber. The rotation-lift assembly 120 may also include a vertical actuator 124 to move the support shaft 118, and thus susceptor 110, in the Z direction (e.g. vertically) within a corresponding process chamber. The rotation-lift assembly 120 optionally includes a tilt adjustment device 126 that is used to adjust the planar orientation of the susceptor 110 in the internal region of a process chamber. Further, the rotation-lift assembly 120 may optionally also include a lateral adjustment device 128 that is utilized to adjust the positioning of the support shaft 118 and/or the susceptor 110 in the x-y plane of a process chamber. Additionally, or alternatively, the rotation-lift assembly 120 includes a pivot mechanism 129 configured to pivot wafer lift shaft 119 of susceptor 110.

The susceptor 110 is shown in an elevated processing position but may be lifted or lowered vertically by the rotation-lift assembly 120 as described in more detail below. The susceptor 110 is lowered to a transfer position (below the processing position) to allow lift pins 152 to contact standoffs 154 coupled to wafer lift shaft 119. The support shaft 118 may move within wafer lift shaft 119 to allow the susceptor to raised, lowered, rotated, etc. The energy transmissive member 156 allows energy to pass through and access substrate 140. In one embodiment, the energy transmissive member 156 may be referred to as, window, and/or dome.

The lift pins 152 are suspended in holes 107 in the susceptor 110, and as the susceptor 110 is lowered and the bottom of the lift pins 152 engage the standoffs 154. Further downward movement of the susceptor 110 causes the lift pins 152 to engage the substrate 140 and hold the substrate 140 stationary as the susceptor 110 is further lowered. Thus, the lift pins 152 support the substrate 140 off of the susceptor 110 for transfer thereof from a process chamber (e.g., the process chamber 200 of FIG. 2). The susceptor 110 may remain stationary while the lift pins 152 are raised and lowed such that the lift pins 152 are able to engage the substrate 140. Further, when the susceptor 110 is positioned such that the lift pins 152 are aligned with standoffs 154, the susceptor 110 may be referred to as being in the home position.

The controller 130 includes a programmable central processing unit (CPU) 132 that is operable with a memory 134. The controller 130 may additionally include or be configured to communicate with a mass storage device (not shown), an input control unit, a display unit (not shown), clock circuitry, memory cache, and input/output (I/O) circuits, among others, coupled to the various components of the susceptor 110 to facilitate control of the susceptor 110. In various embodiments, the controller 130 is further coupled to a process chamber (e.g., process chamber 200 shown in FIG. 2) and configured to control substrate processing in the process chamber. The controller 130 may further include support circuits (not shown). In one embodiment, to facilitate control of the process chamber 200 described below, the CPU 132 may be one of any form of general purpose computer processor that can be used in an industrial setting for controlling various chambers and sub-processors. The memory 134 is in the form of computer-readable storage media that contains instructions, that when executed by the CPU 132, facilitates the operation of the process chamber 200. The instructions in the memory 134 are in the form of a program product such as a program that implements the method of the present disclosure.

In one or more embodiments, the controller 130 is communicatively coupled to the rotation-lift assembly 120 and configured to send commands to the rotation-lift assembly 120. For example, the controller is configured to provide a drive signal to the rotation-lift assembly 120 to instruct the rotation-lift assembly 120 to start and/or stop moving the susceptor 110. The drive signal may instruction the rotation-lift assembly 120 to rotate the susceptor 110 at a certain RPM. Further, the controller 130 may provide commands to the rotation-lift assembly 120 to position the susceptor at the home position.

In various embodiments, the controller 130 receives one or more feedback signals form the rotation-lift assembly 120 via a feedback control loop. For example, the controller 130 is configured to receive a torque feedback signal from the rotation-lift assembly 120. The torque feedback signal corresponds to the amount of torque output by the rotation-lift assembly 120 when rotating the susceptor 110. In one embodiment, the controller 130 is configured to process the torque feedback signal to determine torque data corresponding to the amount torque outputted by the rotation-lift assembly 120 to rotate the susceptor 110 at a specific RPM. The controller 130 may use that torque data to determine if the rotation-lift assembly 120 is experiencing one or more faults and/or is near failure. For example, the controller 130 is configured to compare the torque data to preexisting torque data and issue a notice of a state of the rotation-lift assembly 120 based on the comparison.

The preexisting torque data corresponds to a rotation-lift assembly 120 that performs within expected and/or normal operational parameters. For example, the good preexisting data may correspond to a rotation-lift assembly 120 that is able to rotate the susceptor 110 during processing of a substrate (e.g., substrate 140) at specified speeds and return the substrate and susceptor to a home position when processing is finished. As is described above, the home position corresponds to a position where the substrate 140 may be unloaded. For example, when the substrate is positioned in the home positon, the lift pins 152 are properly aligned standoffs 154, and the substrate 140 may be unloaded from the susceptor 110 without causing damage to the substrate 140. However, when a rotation-lift assembly 120 is experiencing or nearing failure, the rotation-lift assembly 120 often fails to position the substrate and the susceptor 110 at the home position at the end of processing. Instead, the rotation-lift assembly 120 places the substrate and susceptor 110 in an unknown position. Positioning a substrate at an unknown position leads to damage to the substrate 140 during unloading or the inability to unload the substrate 140 from the susceptor 110. For example, the rotation-lift assembly 120 may position the susceptor such that the lift pins 152 are not aligned with the standoffs 154. Accordingly, the substrate 140 may not be lifted and unloaded after processing.

Further, a rotation-lift assembly 120 that is experiencing or is close to failure may not be able to rotate the susceptor 110 at the specified RPMs for the specified period of time. Thus, as rotation speed is a parameter which affects uniformity during the deposition process, when a substrate is processed in a process chamber having a rotation-lift assembly that is experiencing or is close to failure, the thickness of the layers deposited on the substrate may lack uniformity and/or include defects that cause the processed substrate to be unusable.

In conventional embodiments, it is difficult to detect faults within the rotation-lift assembly as the controller may, automatically or in response to an administrator user's input, send additional commands to the rotation-lift assembly instructing the rotation-lift assembly to reposition a susceptor that is not in the home position, at the home position. In such instances, failure of the rotation-lift assembly may go unnoticed and production may be resumed without addressing the faulty rotation-lift assembly, which may lead to additional failures of the corresponding process chamber in the future. Aspects of the disclosure overcome these deficiencies.

Figure 2:
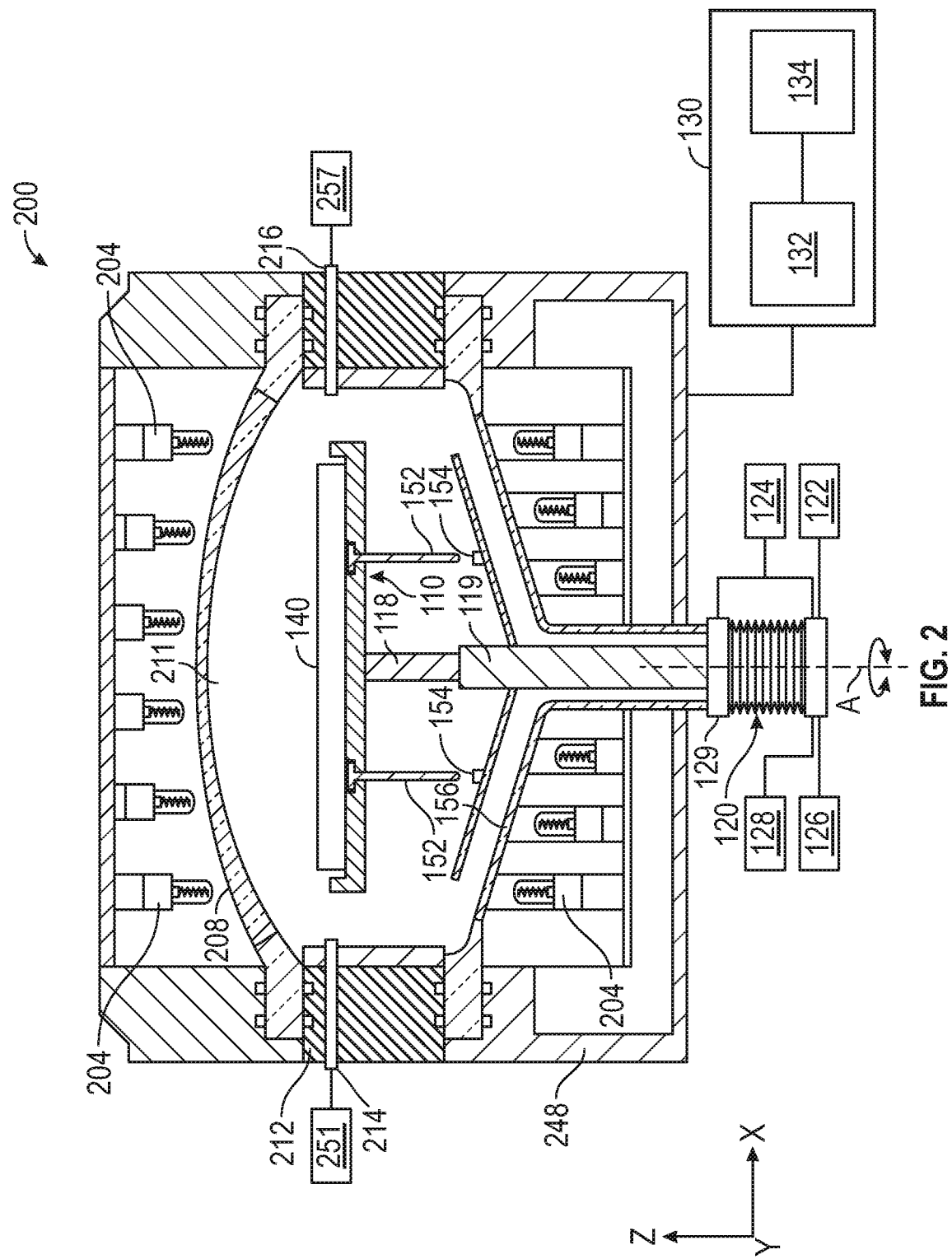
FIG. 2 is a schematic cross sectional side view of a process chamber, according to one or more embodiments.

FIG. 2 illustrates a schematic sectional view of a process chamber 200 according to one embodiment. The process chamber 200 may be used to process one or more substrates therein, including the processes of depositing a material on a substrate 140, heating of the substrate 140, etching of the substrate 140, or combinations thereof. The process chamber 200 generally includes a chamber wall 248, and an array of radiant heating lamps 204 for heating, among other components, a susceptor 110 disposed within the process chamber 200.

The radiant heating lamps 204 heat the susceptor 110 and the substrate 140 as a process gas or vapor passes over the surface of the substrate 140, facilitating the deposition of a material onto the device side of the substrate 140. As shown in FIG. 2, an array of radiant heating lamps 204 may be disposed below and/or above the susceptor 110.

The susceptor 110 is located within the process chamber 200 between energy transmissive member 208, which may be a dome or any other shape, and energy transmissive member 156, which may also be a dome or any other shape. The energy transmissive member 208 and the energy transmissive member 156, along with a body 212 that is disposed between the energy transmissive member 208 and energy transmissive member 156, generally define an internal region 211 of the process chamber 200. The energy transmissive member 208 and/or the energy transmissive member 156 may be optically transparent to the high-energy radiant radiation (transmitting at least 95% of the radiation of the high-energy radiant radiation). Further, the energy transmissive member 208 and the energy transmissive member 156 may be fabricated from quartz. Additionally, the array of radiant heating lamps 204 may be disposed above the energy transmissive member 208.

The radiant heating lamps 204 are configured to heat the substrate 140. For example, the heating lamps 204 may heat the substrate 140 to a temperature within a range of about 200 degrees Celsius to about 1,600 degrees Celsius. Each lamp 204 can be coupled to a power distribution board through which power is supplied to each lamp 204. The radiant heating lamps 204 are positioned within a housing which is configured to be cooled during or after processing by, for example, using a cooling fluid introduced into channels located between the radiant heating lamps 204.

The substrate 140 is transferred into the process chamber 200 and positioned onto the susceptor 110 through a loading port (not shown) formed in the body 212. A process gas inlet 214 and a gas outlet 216 are provided in the body 212.

A robot (not shown) enters the process chamber 200 to engage at least the underside of the substrate 140 and remove the substrate 140 therefrom though the loading port. A new substrate may then be loaded onto the lift pins 152 by the robot, and the susceptor 110 may then be actuated up to place the substrate 140 in the processing position by rotation-lift assembly 120. The susceptor 110 may remain stationary while the lift pins 152 are raised and lowered such that the lift pins 152 are able to engage the substrate 140. Further, after a new substrate 140 is placed on the lift pins 152, the lift pins 152 are lowered while the susceptor 110 remains stationary. The lift pins 152 may include an enlarged head allowing the lift pins 152 to be suspended in openings in the susceptor 110 when in the processing position. The susceptor 110, while located in the processing position, divides the internal volume of the process chamber 200 into a process gas region above the susceptor 110, and a purge gas region below the susceptor 110.

Substrate temperature is measured by sensors configured to measure temperatures at the bottom of the susceptor 110. The sensors may be pyrometers (not shown) disposed in ports formed in the housing of the process chamber (e.g., the process chamber 200).

Process gas supplied from a process gas supply source 251 is introduced into a process gas region through the process gas inlet 214 formed in the sidewall of the body 212. The process gas inlet 214 is configured to direct the process gas in a generally radially inward direction. As such, in some embodiments, the process gas inlet 214 is a side gas injector. The side gas injector is positioned to direct the process gas across a surface of the susceptor 110 and/or the substrate 140. During a film formation process for forming a film layer of the substrate 140, the susceptor 110 is located in the processing position, which is adjacent to and at about the same elevation as the process gas inlet 214. Thus the process gas flows generally across the upper surface of the susceptor 110 and/or the substrate 140. The process gas exits the process gas region through the gas outlet 216 located on the opposite side of the process chamber 200 from the process gas inlet 214. Removal of the process gas through the gas outlet 216 here is facilitated by a vacuum pump 257 coupled thereto.

The above-described process chamber 200 can be controlled by a processor based system controller, such as controller 130. For example, the controller 130 is configured to control flow of various precursor and process gases and purge gases from gas sources, during different operations of a substrate processing sequence. By way of further example, the controller 130 is configured to control a firing of the spot heating module 271, feeding of gases, lamp operation, or other controller parameters, among other controller operations.

The susceptor 110 may be rotated during processing using the rotary actuator 122 of rotation-lift assembly 120 to minimize the effect of thermal and process gas flow spatial anomalies within the process chamber 200 and thus facilitates uniform processing of the substrate 140. The rotation-lift assembly 120 may rotate the susceptor 110 at between about 1 RPM and about 100 RPM. Further, the rotation-lift assembly 120 may rotate the susceptor 110 between about 10 RPM and about 50 RPM. The rotation-lift assembly 120 may be further configured to rotate the susceptor 110 at about 30 RPM. The controller 130 is communicatively coupled to the rotation-lift assembly 120 and is configured to provide instructions to the rotation-lift assembly 120 to rotate the susceptor 110 and/or raise or lower the susceptor 110. The controller 130 may provide a drive signal to rotary actuator 122, instructing the rotary actuator 122 to rotate the susceptor 110.

The rotation-lift assembly 120 may experience wear which makes it difficult for the rotation-lift assembly 120 to return the susceptor 110 to the home position and/or to maintain the susceptor 110 at specified rotation speeds (e.g., RPMs) during processing. Failing or failed rotation-lift assemblies introduce down time to the process chamber 220 and/or loss of processed substrates (e.g., wafer scrap), which both negatively impact production. However, identifying faulty rotation-lift assemblies before a rotation-lift assembly fails, may reduce downtime of a process chamber and/or loss of processed substrates.

As is describe above, the controller 130 is configured to provide a drive signal to the rotation-lift assembly 120, and the rotation-lift assembly 120 is configured to rotate the susceptor 110 based on the drive signal. For example, the drive signal may instruct the rotation-lift assembly 120 to rotate the susceptor 110 with a selected RPM for a period of time. The controller 130 may be further configured to receive a torque feedback signal from the rotation-lift assembly 120. Further, as the rotation-lift assembly 120 experiences wear, the amount of torque required to rotate the susceptor 110 at a selected RPM increases. Further, the rotation-lift assembly 120 may experiences large variations in torque while the susceptor 110 is rotated at a specified RPM. The wear may be due to damage to internal components of the rotation-lift assembly 120. For example, debris may enter the rotation-lift assembly 120 which may cause the rotary actuator 122 to spin off-axis and/or experience increased friction while rotating the susceptor 110.

Figure 3:
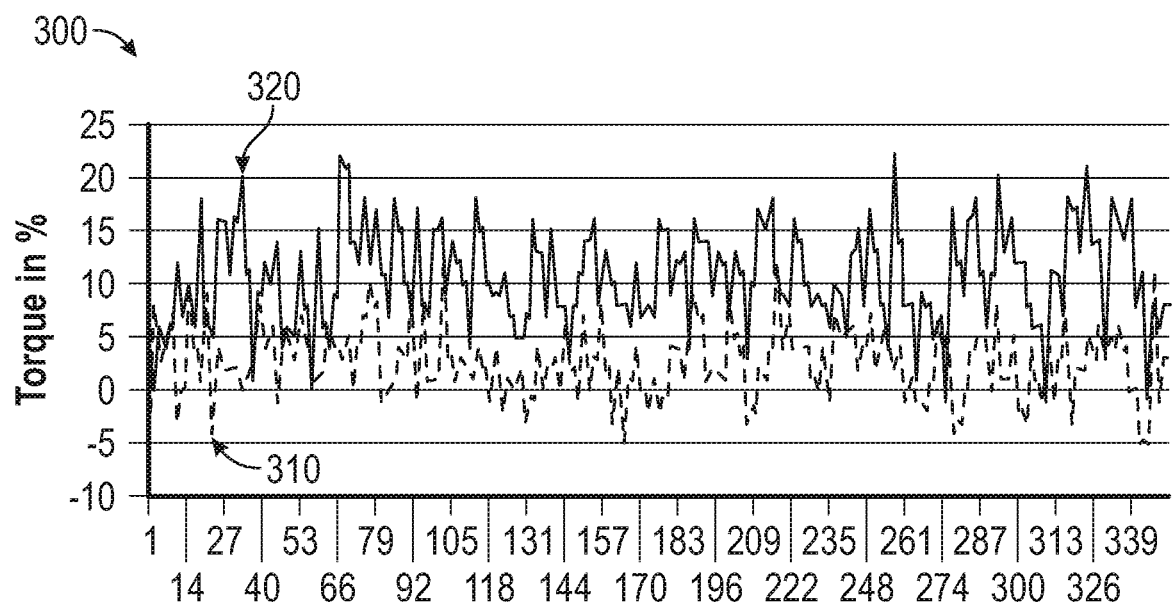
FIGS. 3 and 4 illustrate comparisons of torque data, according to one or more embodiments.

The torque feedback signal corresponds to output torque of the rotation-lift assembly (and the rotary actuator 122). The controller 130 is configured to process the torque feedback signal to identify torque data. The torque data corresponds to the output torque of the rotation-lift assembly (and the rotary actuator 122). Processing the torque feedback signal may comprise tracing the torque data and generating a graph of torque percentage over time. Graph 300 of torque percentage overtime is illustrated in FIG. 3.

Torque output 310 of graph 300 illustrates the torque output of a rotation-lift assembly that is not experiencing a fault. Additionally, the torque output 320 of graph 300 illustrates the torque output of a rotation-lift assembly that is experiencing a fault. As is illustrated by graph 300, the magnitude of the peaks of torque output 320 are greater than those of torque output 310. Further, the variance (e.g., magnitude of difference between peaks and valleys) of torque output 320 is greater than the variance of torque output 310. For example, the difference between positive and negative peaks of torque output 320 is greater than the difference between positive and negative peaks of torque output 310.

The controller 130 compares torque output 310 with torque output 320 to determine if a corresponding rotation-lift assembly may be experiencing failure or may soon experience a fault and requires service. For example, when the difference in magnitude between one or more peaks of torque output 320 and torque output 310 exceeds a threshold amount, a fault may be determined. Further, when the difference between an average value, maximum value, or a median value of the peaks and/or valleys of torque output 320 and torque output 310 exceeds a threshold amount, a fault may be determined. A fault may correspond to a failure of the rotation-lift assembly 120 and/or a pending failure of the rotation-lift assembly 120. For example, the controller 130 may be able to predict failure of a rotation-lift assembly 120 based on the comparison. The controller 130 may be configured to predict failure of the rotation-lift assembly 120 within a predetermined time frame. For example, the controller 130 may be configured to detect rotation-lift assemblies that may experience failure within one or more hours, days and/or months.

The threshold amount may correspond to maximum torque values in which a rotation-lift assembly is able to function within acceptable parameters. For example, the maximum torque value may be the maximum torque value that a rotation-lift assembly is able to output while also being able to position the susceptor 110 in a home position and/or rotate the susceptor 110 at the specified speeds. The threshold value may correspond to an average maximum torque value that a rotation-lift assembly is able to output while also being able to position the susceptor 110 in a home position and/or rotate the susceptor 110 at the specified speeds. The average maximum torque value may be determined by collecting torque data from multiple rotating lift assemblies and averaging the maximum torque output value of each before the rotating lift assemblies are unable to return a susceptor to the home position.

Figure 4:
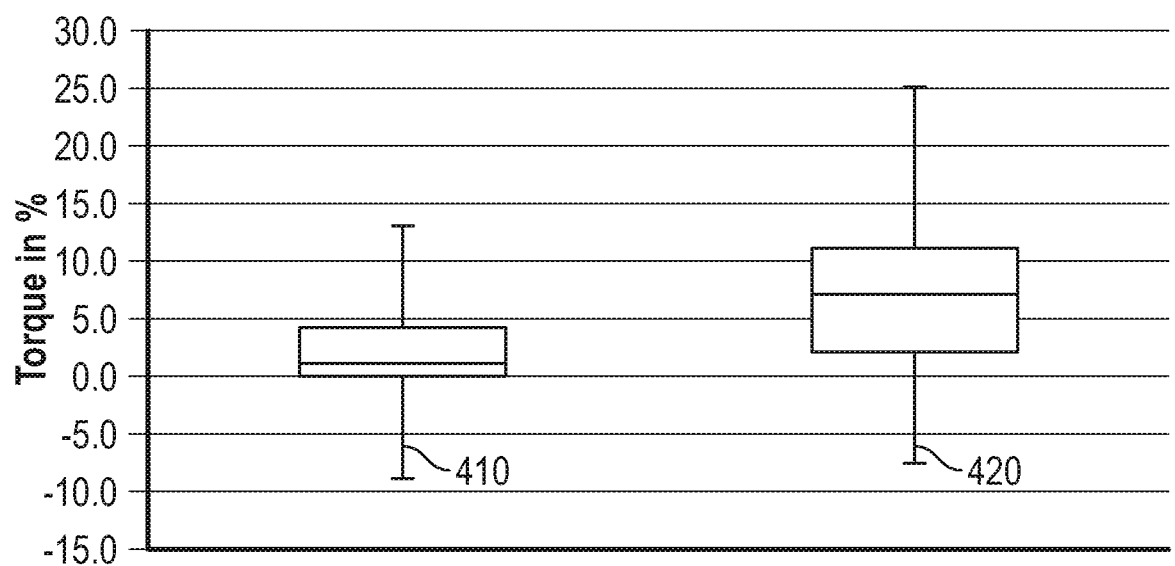

The controller 130 may generate a box plot of the torque output data. For example, as is shown in FIG. 4, a box-whisker plot that compares torque data 420 of a rotation-lift assembly that has failed and torque data 410 of a rotation-lift assembly that has not failed (e.g., preexisting torque data that has been selected as indicative of a desirable operating condition). Alternatively, other types of box plots or other plotting methods may be utilized to compare the torque data. As can be seen from the box-whisker plot, the variance of torque data 420 is greater than that of 410. Further, once the difference in variance exceeds a threshold amount, a failure or a pending failure may be identified. The threshold amount is described above.

Figure 5:
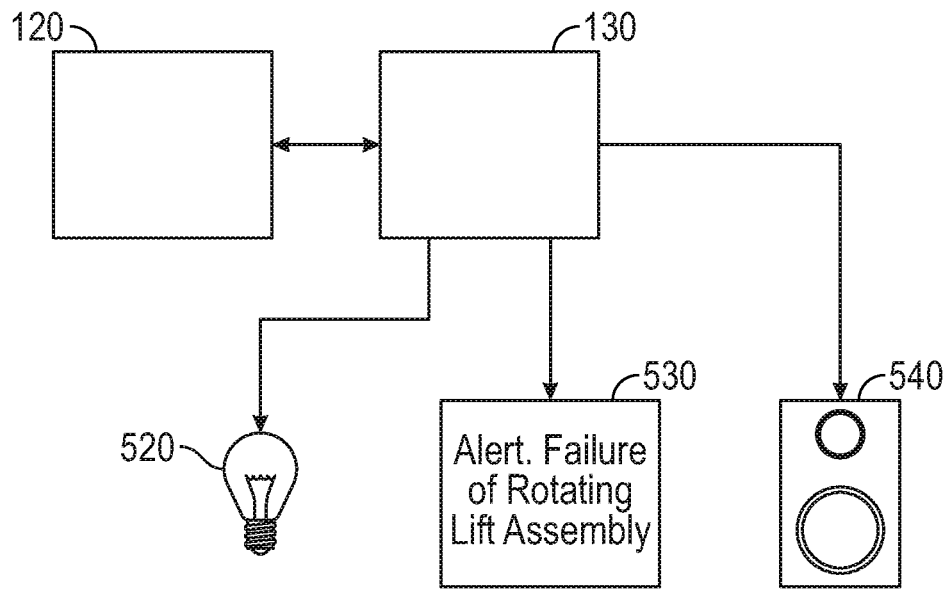
FIG. 5 illustrates a fault identification system, according to one or more embodiments.

The controller 130 issues a notice of a state of the rotation-lift assembly based on the comparison of the torque data to the preexisting torque data. For example, the controller 130 is configured to issue an indication that rotation-lift assembly 120 has or is about to fail based on the comparison. As illustrated in FIG. 5, the controller 130 is configured to turn on an indicator light 520 when a fault has been found with rotation-lift assembly 120. The indicator light 520 may be disposed near a corresponding process chamber (e.g., process chamber 200) or in a panel used to control the corresponding process chamber (e.g., process chamber 200). Further, a text alert 530 may be provided by the controller 190 when a fault in the rotation-lift assembly 120 has been identified. For example, the text alert 530 may be displayed on a screen of a control device controlling the corresponding process chamber, or the text alert 530 may be displayed on computing device registered to an operator (e.g., user administrator) that is charged with monitoring the corresponding process chamber. Further, the controller 130 may be configured to send an audible alert via speaker 540. Speaker 540 may be disposed proximate a process chamber where the faulty rotation-lift assembly has been identified, or the output may identify the process chamber comprising the faulty rotation-lift assembly. Additionally, or alternatively, the controller 130 is configured to stop a process chamber from processing a substrate when a faulty rotation-lift assembly has been identified.

When a rotation-lift assembly has been identified as having one or more faults, the rotation-lift assembly may be removed from the corresponding process chamber. Further, the failing or failed rotation-lift assembly may be replaced with a functioning rotation-lift assembly and the failing or failed rotation-lift assembly is reconditioned.

The rotation-lift assembly 120 may be tested before installation within process chamber 200. For example, rotation-lift assembly 120 may be connected to a test device such that the torque output by the rotation-lift assembly 120 may be measured. The rotation-lift assembly 120 may be instructed via a drive signal to rotate a susceptor (may or may not be connected to the rotation-lift assembly) during test at various different RPMs, during which the torque feedback signal is observed using the above methods to determine if there is a fault within the rotation-lift assembly 120 or if the rotation-lift assembly 120 is close to failure. Further, the rotation-lift assembly 120 may be instructed to place the susceptor at the home position to determine if the rotation-lift assembly 120 is functioning correctly.

Figure 6:
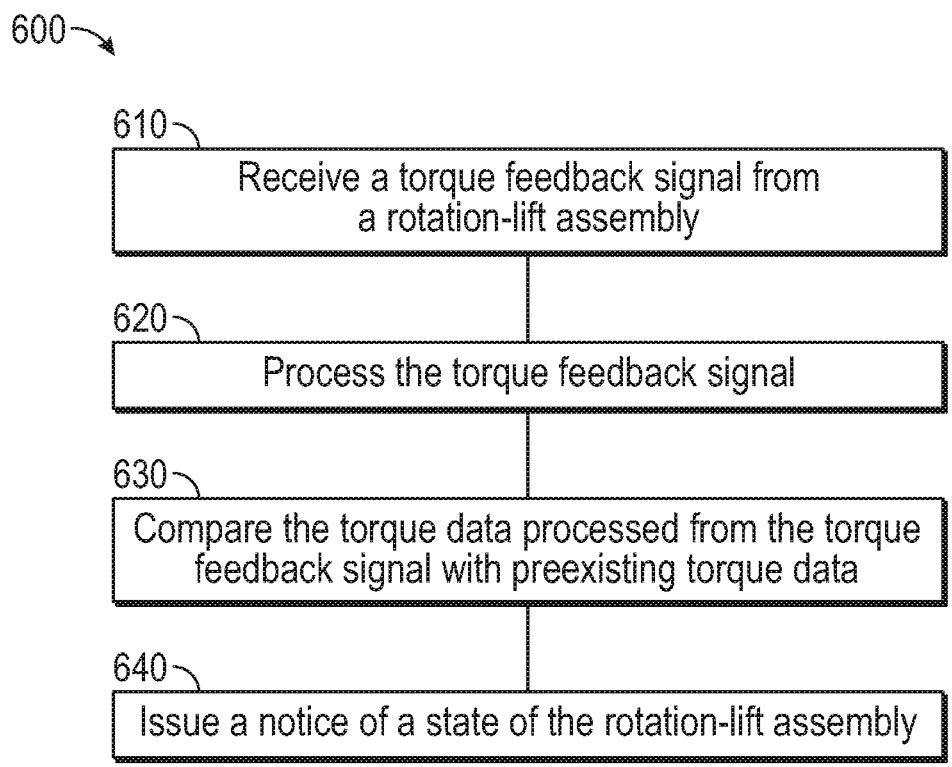
FIG. 6 illustrates a method of monitoring a rotational-lift, according to one or more embodiments.

FIG. 6 illustrates method 600 for monitoring a rotation-lift assembly of a substrate process chamber. At 610 of method 600, a torque feedback signal is received form the rotation-lift assembly. For example, the torque feedback signal may be received by the controller 130 from the rotation-lift assembly 120. Further, the controller 130 is configured to output a drive signal to rotation-lift assembly 120. The rotation-lift assembly 120 is configured to rotate susceptor 110 with an RPM based on drive signal. Further, the rotation-lift assembly 120 outputs the torque feedback signal to the controller 130. The torque feedback signal corresponds to the amount of torque output by the rotation-lift assembly 120.

At 620 of method 600, the torque feedback signal is processed to identify torque data. For example, the controller 130 may trace values of the torque feedback signal for a period of time, and generates a graph of the torque output over that period of time. The torque data may correspond to output torque of the rotation-lift assembly 120 in percentage over time. Further, the controller 130 may store the torque data in a memory (e.g., memory 134 or another memory coupled to controller 130).

At 630 of method 600, the torque data captured from rotation-lift assembly is compared to preexisting torque data. For example, the controller 130 accesses memory 134 to obtain the preexisting torque data and/or the torque data captured from rotation-lift assembly 120. Further, the controller 130 compares the preexisting torque data with the torque data captured from rotation-lift assembly 120. The controller 130 may identify one or more peaks of the torque data captured from rotation-lift assembly 120 and compare those peaks to one or more peaks of the preexisting torque data. Further, the controller 130 may be configured to determine a variance of the torque data captured from rotation-lift assembly 120, and compare that variance to a variance of the preexisting torque data. Additionally, or alternatively, a maximum, minimum, average, and/or median variance may be calculated and used in the comparison. Further, the variance may correspond to a maximum and minimum difference between peaks and valleys of the torque data. For example, the variance may correspond to a difference between a peak and an immediately following or preceding valley, or between a maximum peak and a maximum valley. In another example, the variance corresponds to a difference between average maximum values and minimum values of the torque data.

The controller 190 may generate a Box-Whisker plot from the preexisting torque data and the torque data of the rotation-lift assembly under test, and the Box-Whisker plot is used to compare the two sets of torque data.

The controller 190 may set a flag or other indicator and store the flag within memory 134 based on the comparison. The flag or other indicator may indicate performance of rotation-lift assembly has degraded such that the rotation-lift assembly can be considered to have failed or will fail within an identified time period.

At 640 of method 600, a notice of a state of the rotation-lift assembly is issued based on the comparison of torque data. For example, the controller 130 may determine that the difference between the torque data captured from rotation-lift assembly 120 and preexisting torque data exceeds a threshold value, and, in response, issue a notice. Additionally, or alternatively, the controller 130 may turn on an indicator light, display a textual message, play an audible message, and/or stop a corresponding process chamber when difference between the torque data captured from rotation-lift assembly 120 and preexisting torque data exceeds a threshold value. For example, the controller 130 may read a flag from memory 134, generate a control signal, and communicate the control signal to turn on an indicator light, instruct a display to a display a textual message, play an audible message via a speaker, and/or turn of a corresponding process chamber.

While the foregoing is directed to embodiments of the present disclosure, other and further embodiments of the disclosure may be devised without departing from the basic scope thereof, and the scope thereof is determined by the claims that follow.

What is claimed is:

1. A method for monitoring a rotation-lift assembly of a process chamber, the method comprising:
   rotating, based on a drive signal, a susceptor of the process chamber and a substrate disposed on the susceptor via the rotation-lift assembly to process the substrate;
   receiving a torque feedback signal from the rotation-lift assembly, the torque feedback signal corresponding to an amount of torque output by the rotation-lift assembly to rotate the susceptor of the process chamber and the substrate based on the drive signal;
   processing the torque feedback signal to identify torque data;
   comparing the torque data to preexisting torque data; and
   issuing a notice of a state of the rotation-lift assembly based on the comparison of the torque data to the preexisting torque data, wherein issuing the notice of the state of the rotation-lift assembly comprises at least one of adjusting processing of the substrate, communicating an alert message, and turning on an indicator light.

2. The method of claim 1, wherein identifying the torque data comprises generating a graph of torque percentage over time.

3. The method of claim 1, wherein comparing the torque data to the preexisting torque data comprises determining if a difference between the torque data and the preexisting torque data exceeds a threshold amount.

4. The method of claim 3, wherein determining the difference between the torque data and the preexisting torque data comprises determining if a variance of the torque data exceeds a variance of the preexisting torque data by the threshold amount.

5. The method of claim 4, wherein the variance of the torque data corresponds to a difference between a peak and a valley of the torque data and the variance of the preexisting torque data corresponds to a difference between a peak and a valley of the preexisting torque data.

6. The method of claim 3, wherein determining the difference between the torque data and the preexisting torque data comprises generating a box plot of the torque data and a box plot of the preexisting torque data.

7. A substrate process chamber comprising:
a susceptor comprising a support shaft, the susceptor is configured to support a substrate for processing within the substrate process chamber;
a rotation-lift assembly configured to:
rotate the susceptor and the substrate disposed on the susceptor during processing; and
output a torque feedback signal corresponding to an amount of torque output by the rotation-lift assembly to rotate the susceptor and the substrate; and
a controller coupled to the rotation-lift assembly and configured to:
receive the torque feedback signal;
process the torque feedback signal to identify torque data corresponding to torque output by the rotation-lift assembly when rotating the susceptor and the substrate;
compare the torque data to preexisting torque data; and
issue a notice of a state of the rotation-lift assembly based on the comparison of the torque data to the preexisting torque data, wherein issuing the notice of the state of the rotation-lift assembly comprises at least one of stopping processing within the substrate process chamber, communicating an alert message, and turning on an indicator light.

8. The substrate process chamber of claim 7, wherein identifying the torque data comprises generating a graph of torque percentage over time.

9. The substrate process chamber of claim 7, wherein comparing the torque data to the preexisting torque data comprises determining if a difference between the torque data and the preexisting torque data exceeds a threshold amount.

10. The substrate process chamber of claim 9, wherein determining the difference between the torque data and the preexisting torque data comprises determining if a variance of the torque data exceeds a variance of the preexisting torque data by the threshold amount.

11. The substrate process chamber of claim 10, wherein the variance of the torque data corresponds to a difference between a peak and a valley of the torque data and the variance of the preexisting torque data corresponds to a difference between a peak and a valley of the preexisting torque data.

12. The substrate process chamber of claim 9, wherein determining the difference between the torque data and the preexisting torque data comprises generating a box plot of the torque data and a box plot the preexisting torque data.

13. The substrate process chamber of claim 9, wherein the preexisting torque data corresponds a second rotation-lift assembly that is free of faults.

14. A non-transitory computer readable storage medium having stored thereon instructions that, when executed by a processor, cause the processor to perform a method for monitoring a rotation-lift assembly for a process chamber, the method comprising:
rotating, based on a drive signal, a susceptor of the process chamber and a substrate via the rotation-lift assembly to process the substrate within the process chamber;
receiving a torque feedback signal from the rotation-lift assembly, the torque feedback signal corresponding to an amount of torque output by the rotation-lift assembly to rotate the susceptor of the process chamber and the substrate based on the drive signal;
processing the torque feedback signal to identify torque data;
comparing the torque data to preexisting torque data; and
issuing a notice of a state of the rotation-lift assembly based on the comparison of the torque data to the preexisting torque data, wherein issuing the notice of the state of the rotation-lift assembly comprises at least one of adjusting processing of the substrate, communicating an alert message, and turning on an indicator light.

15. The non-transitory computer readable storage medium of claim 14, wherein identifying the torque data comprises generating a graph of torque percentage over time.

16. The non-transitory computer readable storage medium of claim 14, wherein comparing the torque data to the preexisting torque data comprises determining if a difference between the torque data and the preexisting torque data exceeds a threshold amount.

17. The non-transitory computer readable storage medium of claim 16, wherein determining the difference between the torque data and the preexisting torque data comprises determining if a variance of the torque data exceeds a variance of the preexisting torque data by the threshold amount.

18. The non-transitory computer readable storage medium of claim 16, wherein determining the difference between the torque data and the preexisting torque data comprises generating a box plot of the torque data and a box plot of the preexisting torque data.

\* \* \* \* \*